(12) United States Patent
Guillaume et al.

(10) Patent No.: US 12,382,845 B2
(45) Date of Patent: Aug. 5, 2025

(54) METHOD FOR MANUFACTURING RESISTIVE MEMORY CELLS

(71) Applicant: Commissariat á l'Energie Atomique et aux Energies Alternatives, Paris (FR)

(72) Inventors: Nicolas Guillaume, Grenoble (FR); Serge Blonkowski, Grenoble (FR); Christelle Charpin-Nicolle, Grenoble (FR); Eric Jalaguier, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 491 days.

(21) Appl. No.: 17/820,708

(22) Filed: Aug. 18, 2022

(65) Prior Publication Data
US 2023/0056916 A1  Feb. 23, 2023

(30) Foreign Application Priority Data
Aug. 23, 2021  (FR) ..................... 21 08834

(51) Int. Cl.
*H10N 70/00* (2023.01)
(52) U.S. Cl.
CPC ................. *H10N 70/063* (2023.02)
(58) Field of Classification Search
None
See application file for complete search history.

(56) References Cited

U.S. PATENT DOCUMENTS

| | | |
|---|---|---|
| 2008/0237693 A1 | 10/2008 | Lee et al. |
| 2011/0068312 A1 | 3/2011 | Sekine et al. |
| 2011/0210303 A1 | 9/2011 | Muraoka et al. |
| 2022/0336497 A1* | 10/2022 | Koo ............... H10D 62/115 |

OTHER PUBLICATIONS

French Preliminary Search Report Issued May 18, 2022 in French Application 21 08834 filed on Aug. 23, 2021 (with English Translation of Categories of Cited Documents & Written Opinion), 10 pages.

* cited by examiner

*Primary Examiner* — Sarah K Salerno
(74) *Attorney, Agent, or Firm* — Oblon, McClelland, Maier & Neustadt, L.L.P.

(57) ABSTRACT

This method comprises the following steps:
  a) providing a stack successively comprising:
    a substrate;
    a first electrode;
    a first dielectric layer, having a first electrical strength;
    a second metal electrode;
    a second dielectric layer, having a second dielectric strength that is strictly less than the first dielectric strength;
    a third electrode;
  the first dielectric layer and the second electrode having a first interface, the second dielectric layer and the second electrode having a second interface;
  b) etching the stack by bombardment with electrically charged species, so as to define resistive memory cells;
  the bombardment of step b) being adapted so that electrically charged species accumulate at the first and second interfaces of each resistive memory cell, so as to generate an electric field that is strictly less than the first electrical strength and is strictly greater than the second dielectric strength.

6 Claims, 2 Drawing Sheets

METHOD FOR MANUFACTURING RESISTIVE MEMORY CELLS

TECHNICAL FIELD

The invention relates to the technical field of resistive memories (ReRAM for "Resistive Random Access Memory"). Resistive memories are non-volatile memories, i.e., capable of retaining information in the absence of electrical power, belonging to the family of resistive switching memories. Resistive memories are considered to be an emerging technology as they are not as established as conventional non-volatile memories, such as Flash memories.

In particular, the invention is particularly applicable for manufacturing metal oxide resistive memory cells (OxRAM for "Oxide Random Access Memory").

PRIOR ART

As shown in FIG. 1, a resistive memory cell, known from the prior art, is formed from a stack successively comprising a substrate 100, a first electrode 200, a dielectric layer 300, and a second electrode 400. The first electrode 200, the dielectric layer 300, and the second electrode 400 form a Metal-Insulator-Metal (MIM) structure.

A method for manufacturing resistive memory cells, known from the prior art, comprises an initial electroforming (or forming) step, involving applying an electric voltage $V_{Forming}$ between the first and second electrodes of the stack, adapted to generate an electric field that is greater than the dielectric strength of the dielectric layer. This results in the breakdown of the dielectric layer, accompanied by the formation of an electrical conduction path within the dielectric layer, connecting the first and second electrodes.

The operation of a resistive memory cell results in reset cycles, in which the electrical conduction path is broken, and set cycles, in which the electrical conduction path is re-formed. More specifically, a resistive memory cell has a High Resistance State ($H_{RS}$) when the electrical conduction path is broken, and a Low Resistance State ($L_{RS}$) when the electrical conduction path is re-formed. The reset cycles result in a switch from the $L_{RS}$ state to the $H_{RS}$ state, characterized by the application of an electric voltage $V_{Reset}$ between the first and second electrodes of the resistive memory cell. The write cycles result in a switch from the $H_{RS}$ state to the $L_{RS}$ state, characterized by the application of an electric voltage $V_{Set}$ between the first and second electrodes of the resistive memory cell.

The switches between the $H_{RS}$ and $L_{RS}$ states can be unipolar, bipolar, or non-polar depending on the implemented switching physics and the roles played by the dielectric layer and the first and second electrodes of the resistive memory cell. More specifically, the switches between the $H_{RS}$ and $L_{RS}$ states are:
  (i) unipolar when the electric voltages $V_{Set}$ and $V_{Reset}$ are the same sign;
  (ii) bipolar when the electric voltage $V_{Set}$ is the same sign, and the electric voltage $V_{Reset}$ is the opposite sign;
  (iii) non-polar when the electric voltage $V_{Set}$ can have a positive or negative sign, and the electric voltage $V_{Reset}$ has the opposite sign.

The electroforming step of the prior art is not entirely satisfactory in so far as it involves a high electric voltage $V_{Forming}$ (much higher than $V_{Set}$), in order to generate an electric field that is greater than the dielectric strength of the dielectric layer of the stack, so as to breakdown the dielectric layer. Therefore, the dielectric layer is highly stressed and the dielectric material risks being irreparably damaged. However, the breakdown of the dielectric layer must be reversible in order to rebuild the electrical conduction path. To this end, a transistor generally must be arranged in series with the stack in order to control the intensity of the current circulating between the first and second electrodes of the stack (intensity typically limited to a few hundred µA).

DISCLOSURE OF THE INVENTION

The aim of the invention is to overcome all or some of the aforementioned disadvantages. To this end, the aim of the invention is a method for manufacturing resistive memory cells, comprising the following steps:
  a) providing a stack successively comprising:
    a substrate, preferably comprising transistors and an interconnection structure;
    a first electrode;
    a first dielectric layer, having a first electrical strength;
    a second metal electrode;
    a second dielectric layer, having a second dielectric strength that is strictly less than the first dielectric strength;
    a third electrode;
    the first dielectric layer and the second electrode having a first interface, the second dielectric layer and the second electrode having a second interface;
  b) etching the stack by bombardment with electrically charged species, so as to define resistive memory cells;
  the bombardment of step b) being adapted so that electrically charged species accumulate at the first and second interfaces of each resistive memory cell, so as to generate an electric field that is strictly less than the first electrical strength and is strictly greater than the second dielectric strength.

Definitions

"Substrate" is understood to mean a self-supporting physical medium, such as a wafer, for example, cut from a single crystal ingot of semiconductor material.

"Interconnection structure" is understood to mean a stack of interconnection levels comprising metal tracks separated by a dielectric material. An interconnection structure can be formed on the substrate in a BEOL (Back-End-Of-Line) electrical interconnection levels manufacturing line. The transistors can be monolithically integrated into the substrate in a Front-End-Of-Line (FEOL) semiconductor device manufacturing line, using, for example, photolithography, etching, dopant diffusion and implantation, metal deposition, passivation, and other techniques.

"Dielectric strength" is understood to mean the maximum value of the electric field that the corresponding dielectric layer can withstand before a dielectric breakdown.

"Adapted bombardment" is understood to mean that the bombardment parameters (for example, the energy and the dose for reactive ion etching) are adjusted to generate the desired electric field strength.

Thus, such a method according to the invention allows an electroforming step of the prior art to be dispensed with, by benefiting from adapted etching of the stack (defining the resistive memory cells) to generate an electric field that allows the second dielectric layer (called active layer) to breakdown. Such a method according to the invention therefore allows the intensity of the electric current (of the order of μA compared to the hundreds of μA of the prior art) circulating within the second dielectric layer to be limited, via an electrical conduction path that is obtained by breakdown, so that it is possible to dispense with a transistor for controlling the intensity of the electric current. This is achieved by virtue of the presence of the first dielectric layer (called passive layer) and the second metal electrode, which is an intermediate layer that allows the electrically charged species to be trapped.

The electric field generated in step b) is less than the first dielectric strength so as to avoid the breakdown of the first dielectric layer. Such a breakdown would be detrimental since the electrically charged species accumulated at the first and second interfaces could then escape towards the first electrode, thereby preventing the breakdown of the second dielectric layer and the formation of the electrical conduction path therein.

The method according to the invention can comprise one or more of the following features.

According to one feature of the invention, the electrically charged species accumulate in step b) at the first and second interfaces of each resistive memory cell, according to a surface charge density adapted to generate the electric field that is strictly less than the first electrical strength and is strictly greater than the second dielectric strength.

Thus, the bombardment parameters (for example, the energy and the dose for reactive ion etching) are adjusted to adapt the surface charge density to the desired electric field intensity.

According to one feature of the invention, the thickness of the first dielectric layer of the stack provided in step a) is selected as a function of the electric field generated in step b) so as to allow a tunnel current circulating between the first and second electrodes.

Definition

"Tunnel current" is understood to mean an electric current with an electrical conduction mechanism that involves a tunnel effect, i.e., the "direct tunnel" mechanism or the "Fowler-Nordheim" mechanism, depending on the shape of the potential barrier experienced by the electrons.

Thus, one advantage that is provided by such electrical conduction regimes (involving a first ultra-thin dielectric layer) is to significantly reduce the electrical resistance of the first dielectric layer compared to a thin layer, while avoiding an ohmic conduction regime. Such tunnel effect conduction regimes allow the electrical resistance of the first dielectric layer to be rendered negligible compared to the electrical resistance, denoted $R_{off}$, of the second dielectric layer when the resistive memory cell assumes a high resistance state $H_{RS}$. In other words, such tunnel effect conduction regimes allow the drop in electrical potential between the first and second electrodes to be significantly limited when the electric voltage $V_{Reset}$ is applied between the first and third electrodes of the resistive memory cell.

According to one feature of the invention, the method comprises:
  a step c) involving applying a first electric voltage, denoted $V_{Set}$, between the first and third electrodes of each resistive memory cell, adapted to form an electrical conduction path within the second dielectric layer connecting the second and third electrodes;
  a step d) involving applying a second electric voltage, denoted $V_{Reset}$, between the first and third electrodes of each resistive memory cell, adapted to break the electrical conduction path formed in step c);

In which method the second dielectric layer of each resistive memory cell has, on completion of step d), an electrical resistance denoted $R_{off}$, preferably ranging between $10^4$ and $2.10^5$ ohms;
  and in which the first dielectric layer of the stack provided in step a) is adapted to have an electrical resistance that is strictly less than $R_{off}$, preferably less than or equal to $R_{off}/10$.

Thus, it has been experimentally noted that the resistive memory cells obtained on completion of step b) are not directly in a low resistance state $L_{RS}$. Such a step c), which is performed after step b), allows the low resistance state $L_{RS}$ to be imposed.

Step d) allows the low resistance state $L_{RS}$ obtained in step c) to be switched to a high resistance state $H_{RS}$.

Such a first dielectric layer allows the drop in electrical potential between the first and second electrodes to be significantly limited when the electric voltage $V_{Reset}$ is applied between the first and third electrodes of the resistive memory cell.

According to one feature of the invention, step a) is performed so that the second dielectric layer is made of a hafnium oxide, and the bombardment of step b) is adapted so that electrically charged species accumulate at the first and second interfaces of each resistive memory cell, according to a surface charge density ranging between $10^{13}$ C per cm$^2$ and $5.10^{13}$ C per cm$^2$.

Thus, one advantage that is provided is to generate an electric field of the order of $3\ 10^6$ V/cm, that is greater than the dielectric strength of a hafnium oxide, by applying Gauss's theorem. When the breakdown occurs within the second dielectric layer, if the created electrical conduction path is considered to be a filament with a cross-section of 1 nm$^2$ and that the electrically charged species are electrons with a speed of the order of the Fermi speed (of the order of $10^5$ m/s), the electrical current circulating between the second and third electrodes is of the order of μA.

According to one feature of the invention, step b) is performed using an etching technique selected from among:
  reactive ion etching;
  plasma etching.

Thus, one advantage that is provided by such etching techniques is to involve electrically charged species.

A further aim of the invention is a stack for manufacturing resistive memory cells, successively comprising:
  a substrate, preferably comprising transistors and an interconnection structure;
  a first electrode;
  a first dielectric layer, having a first electrical strength;
  a second metal electrode;
  a second dielectric layer, having a second dielectric strength that is strictly less than the first dielectric strength;
  a third electrode.

According to one feature of the invention, the thickness of the second electrode ranges between 5 nm and 100 nm, preferably between 5 nm and 40 nm.

According to one feature of the invention, the second electrode is made of at least one metal material selected from among:
  Au, Ag, Pt, Pd, Ir, Rh, Os, Ru, Cu, Re, Hg;
  TiN, TaN.

In particular, one advantage that is provided by Au, Ag, Pt, Pd, Ir, Rh, Os, Ru, Cu, Re, Hg is their high oxidation resistance. This property allows the risks of metal ion migration towards the first electrode to be reduced, which would potentially allow the electrically charged species that have accumulated at the first and second interfaces to escape towards the first electrode. Such a migration of metal ions would therefore make the breakdown of the second dielectric layer, and thereby the formation of the electrical conduction path therein, more difficult to achieve.

According to one feature of the invention, the first and third electrodes are made of at least one material selected from among Ti, TiN, Pt, Zr, Al, Hf, Ta, TaN, C, Cu, Ag, W.

According to one feature of the invention, the thickness of the first dielectric layer ranges between 1 nm and 3 nm.

Thus, one advantage that is provided is to allow a tunnel effect electrical conduction regime.

According to one feature of the invention, the thickness of the second dielectric layer ranges between 4 nm and 15 nm, preferably between 5 nm and 10 nm.

According to one feature of the invention, the second dielectric layer is made of a material selected from among hafnium oxide, titanium oxide, tantalum oxide, nickel oxide, zinc oxide, copper oxide, zinc titanate, manganese oxide, magnesium oxide, zirconium oxide, silicon oxide, silicon nitride.

According to one feature of the invention:
the first dielectric layer is made of a material selected from among alumina, a silicon nitride, a silicon oxide;
the second dielectric layer is made of a hafnium oxide.

Thus, one advantage that is provided by a material selected from among alumina, a silicon nitride, a silicon oxide is to have greater dielectric strength than a hafnium oxide.

According to one feature of the invention:
the first dielectric layer is made of a hafnium oxide;
the second dielectric layer is made of a titanium oxide.

Thus, one advantage that is provided by a hafnium oxide is to have greater dielectric strength than a titanium oxide.

BRIEF DESCRIPTION OF THE DRAWINGS

Further features and advantages will become apparent from the detailed disclosure of various embodiments of the invention, with the disclosure being accompanied by examples and references to the accompanying drawings.

Figure 1:
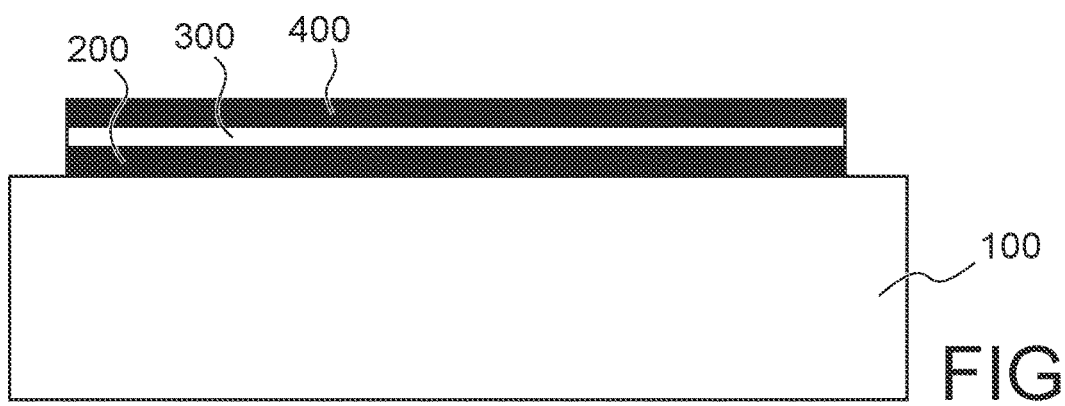
FIG. 1 (already described) is a schematic cross-sectional view of a stack of the prior art for manufacturing resistive memory cells.

It should be noted that the drawings described above are schematic, and are not to scale for the sake of readability and to simplify their understanding.

DETAILED DISCLOSURE OF THE EMBODIMENTS

For the sake of simplicity, identical elements or elements performing the same function will use the same reference signs for the various embodiments.

An aim of the invention is a method for manufacturing resistive memory cells C, comprising the following steps:
a) providing a stack successively comprising:
a substrate 1, preferably comprising transistors and an interconnection structure (not shown);
a first electrode 2;
a first dielectric layer 3, having a first electrical strength;
a second metal electrode 4;
a second dielectric layer 5, having a second dielectric strength that is strictly less than the first dielectric strength;
a third electrode 6;
the first dielectric layer 3 and the second electrode 4 having a first interface $I_1$, the second dielectric layer 5 and the second electrode 4 having a second interface $I_2$;
b) etching the stack by bombardment with electrically charged species, so as to define resistive memory cells C;
the bombardment of step b) being adapted so that electrically charged species accumulate at the first and second interfaces $I_1$, $I_2$ of each resistive memory cell C, so as to generate an electric field that is strictly less than the first electrical strength and is strictly greater than the second dielectric strength.

Figure 2:
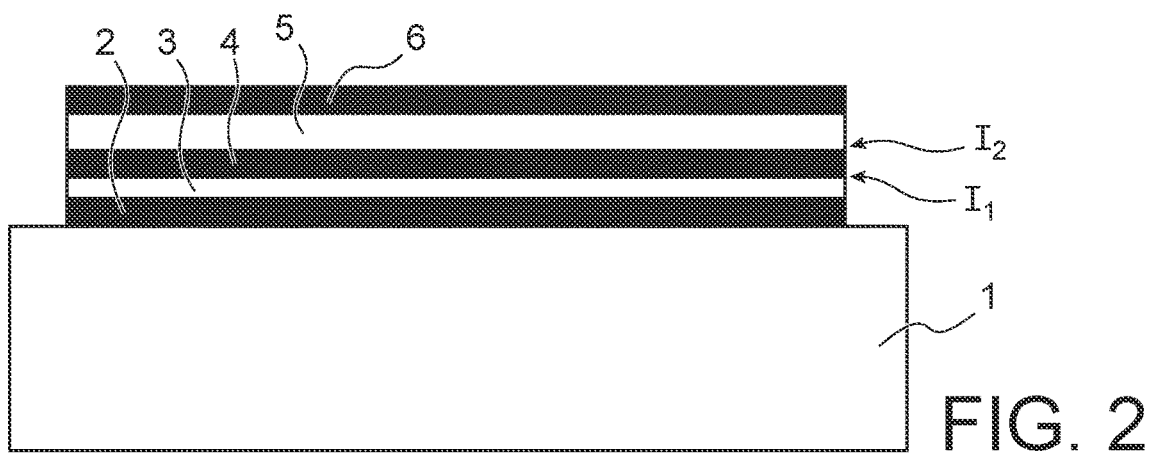
FIG. 2 is a schematic cross-sectional view of a stack according to the invention for manufacturing resistive memory cells.
Figure 3:
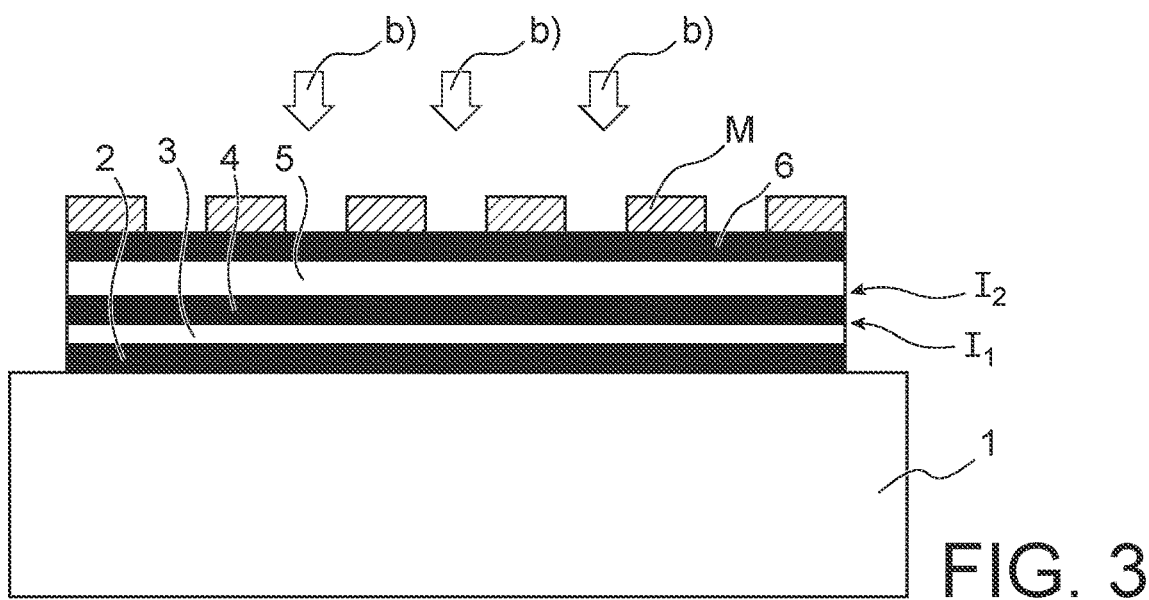
FIG. 3 is a schematic cross-sectional view, illustrating the etching step b) (represented by the arrows) of a method according to the invention.
Figure 4:
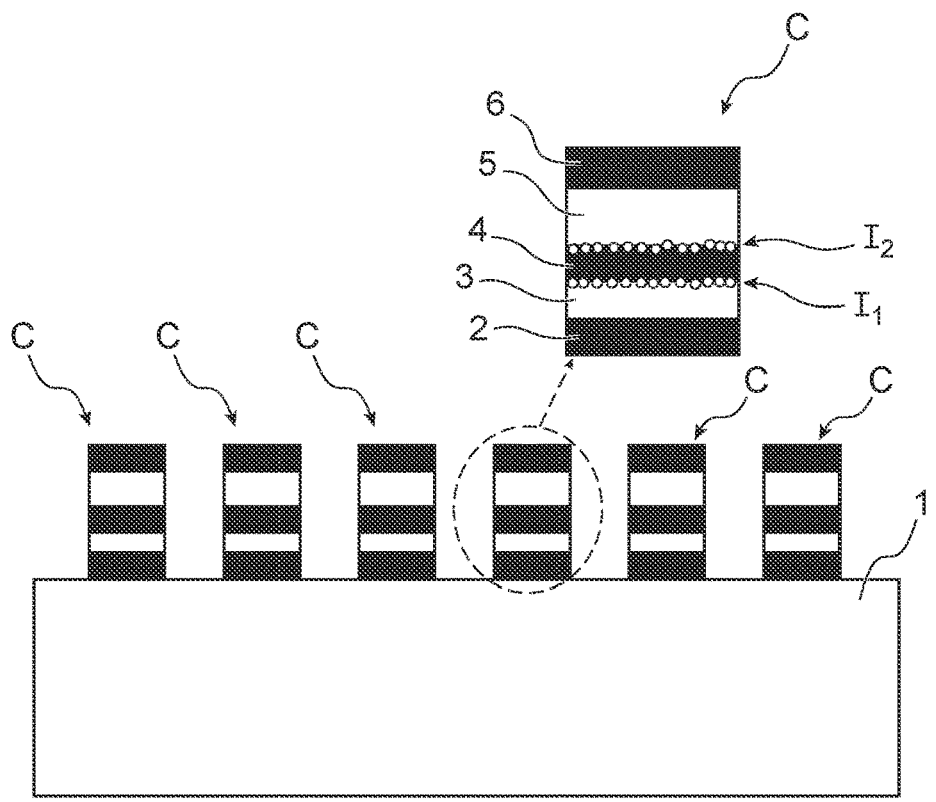
FIG. 4 is a schematic cross-sectional view, illustrating resistive memory cells formed by the etching of step b). The inset illustrates a resistive memory cell on a magnified scale showing the accumulation of electrically charged species (represented by circles) at the first and second interfaces.
Figure 5:
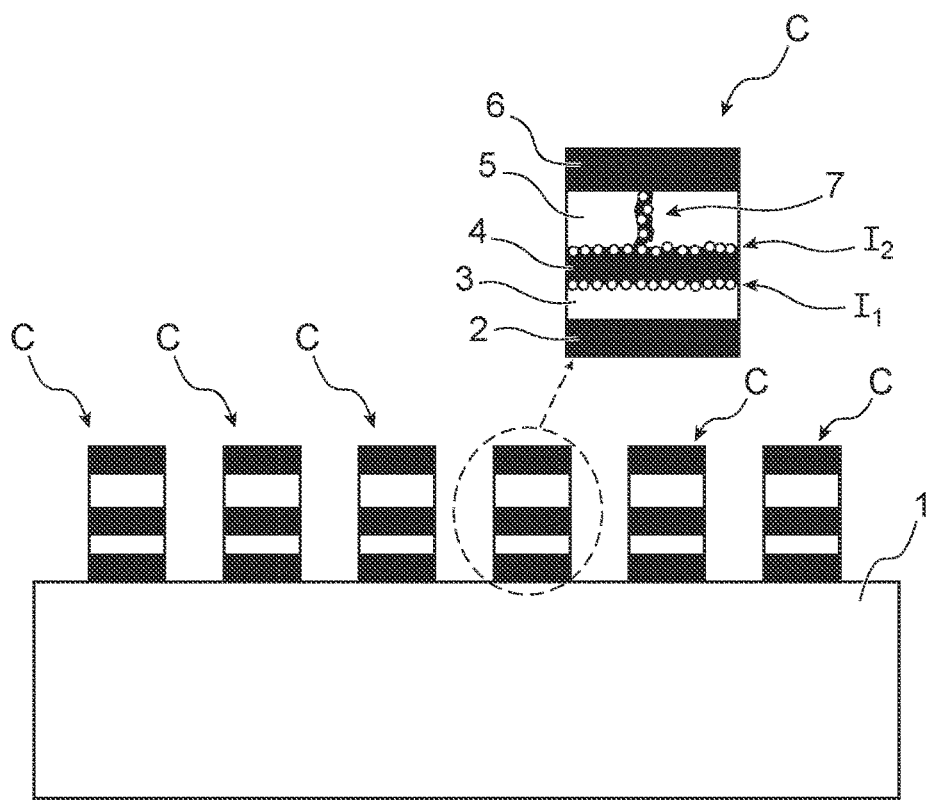
FIG. 5 is a similar view to FIG. 4. The inset illustrates the formation of an electrical conduction path within the second dielectric layer, on completion of step b).

The stack provided in step a) is shown in FIG. 2. The stack, following the lithography step and before the etching step b), is shown in FIG. 3. The accumulation of electrically charged charges at the first and second interfaces $I_1$, $I_2$ is shown in FIG. 4. The breakdown of the second dielectric layer 5 obtained on completion of step b) is shown in FIG. 5.

Step a): Substrate

By way of a non-limiting example, step a) can be performed so that the substrate 1 is a silicon wafer.

The substrate 1 advantageously comprises transistors that can be monolithically integrated into the substrate 1 in an FEOL (Front-End-Of-Line) semiconductor device manufacturing line, using, for example, photolithography, etching, dopant diffusion and implantation, metal deposition, passivation, and other techniques.

The substrate 1 advantageously comprises an interconnection structure that can be formed on the substrate 1 in a BEOL (Back-End-Of-Line) electrical interconnection levels manufacturing line.

The first electrode 2, the first dielectric layer 3, the second electrode 4, the second dielectric layer 5 and the third electrode 6 advantageously extend between two interconnection levels (metal levels) of the interconnection structure. The transistors and the interconnection structure can be located at lower levels relative to the first electrode 2, the first dielectric layer 3, the second electrode 4, the second dielectric layer 5 and the third electrode 6.

Step a): First Electrode

Step a) is advantageously performed so that the first electrode 2 is made of at least one material selected from among Ti, TiN, Pt, Zr, Al, Hf, Ta, TaN, C, Cu, Ag, W. The first electrode 2 can be an alloy of these materials.

The thickness of the first electrode 2 can be greater than or equal to 5 nm or greater than or equal to 10 nm.

The first electrode 2 can be formed on a via of a metal level of the interconnection structure. The first electrode 2 can be made of the via material or of another material (different from the via material) deposited on the via.

Step a): First Dielectric Layer

The thickness of the first dielectric layer 3 of the stack provided in step a) is advantageously selected as a function of the electric field generated in step b), so as to allow a tunnel current circulating between the first and second electrodes 2, 4. Step a) is advantageously performed so that the thickness of the first dielectric layer 3 ranges between 1 nm and 3 nm, preferably between 1 nm and 2 nm.

The first dielectric layer 3 of the stack provided in step a) is advantageously adapted to have an electrical resistance that is strictly less than $R_{off}$, preferably less than or equal to $R_{off}/10$ (see the "Operating the resistive memory cells" section for the definition of $R_{off}$).

Step a): Second Electrode

Step a) is advantageously performed so that the thickness of the second electrode 4 ranges between 5 nm and 100 nm, preferably between 5 nm and 40 nm.

Step a) is advantageously performed so that the second electrode 4 is made of at least one metal material selected from among:

Au, Ag, Pt, Pd, Ir, Rh, Os, Ru, Cu, Re, Hg;
TiN, TaN.

The second electrode 4 can be made of an electrically conductive alloy.

Step a): Second Dielectric Layer

The second dielectric layer 5 forms the active layer of the resistive memory cell C. In other words, the second dielectric layer 5 forms the memory layer.

Step a) is advantageously performed so that the thickness of the second dielectric layer 5 ranges between 4 nm and 15 nm, preferably between 5 nm and 10 nm.

Step a) is advantageously performed so that the second dielectric layer 5 is made of a material selected from among hafnium oxide, titanium oxide, tantalum oxide, nickel oxide, zinc oxide, copper oxide, zinc titanate, manganese oxide, magnesium oxide, zirconium oxide, silicon oxide, silicon nitride.

By way of a non-limiting example, when the second dielectric layer 5 is made of a hafnium oxide, then the first dielectric layer 3 can be made of a material selected from among alumina, a silicon nitride, a silicon oxide.

By way of a non-limiting example, when the second dielectric layer 5 is made of a titanium oxide, then the first dielectric layer 3 can be made of a hafnium oxide. In this embodiment, the hafnium oxide is passive and the (active) memory layer is made of a titanium oxide. The hafnium oxide has a dielectric strength that is greater than a titanium oxide.

Step a): Third Electrode

Step a) is advantageously performed so that the third electrode 6 is made of at least one material selected from among Ti, TiN, Pt, Zr, Al, Hf, Ta, TaN, C, Cu, Ag, W. The third electrode 6 can be an alloy of these materials or a stack of part of these materials.

The thickness of the third electrode 6 can be greater than or equal to 10 nm.

The third electrode 6 advantageously comprises a layer intended to provide a getter function for trapping oxygen atoms. By way of a non-limiting example, the third electrode 6 can be a Ti/TiN or Ti/TaN stack, with the Ti layer being proximal relative to the second dielectric layer 5. The Ti layer provides a getter function for trapping oxygen atoms.

Step b): Etching

As shown in FIG. 3, the stack is covered with a mask M before the etching step b). The mask M can be a solid mask or a resin.

As shown in FIGS. 4 and 5, the electrically charged species advantageously accumulate in step b) at the first and second interfaces 11, 12 of each resistive memory cell C, according to a surface charge density adapted to generate the electric field that is strictly less than the first electrical strength and is strictly greater than the second dielectric strength.

When step a) is performed so that the second dielectric layer 5 is made of a hafnium oxide, the bombardment of step b) is advantageously adapted so that electrically charged species accumulate at the first and second interfaces $I_1$, $I_2$ of each resistive memory cell C, according to a surface charge density typically ranging between $10^{13}$ C per cm$^2$ and $5.10^{13}$ C per cm$^2$.

Step b) is advantageously performed using an etching technique selected from among:

reactive ion etching;
plasma etching.

By way of a non-limiting example, when the first electrode 2 is made of TiN, the second electrode 4 is made of TiN, the third electrode 6 is made of Ti/TiN, and the second dielectric layer 5 is made of $HfO_2$, step b) can use chlorine-based chemistry.

Operating the Resistive Memory Cells

The method can comprise a step c) involving applying a first electric voltage, denoted $V_{Set}$, between the first and third electrodes 2, 6 of each resistive memory cell C, adapted to form an electrical conduction path 7 (shown in FIG. 5) within the second dielectric layer 5 connecting the second and third electrodes 4, 6. By way of an example, $V_{Set}$ can range between 1 V and 3 V.

The method can comprise a step d) involving applying a second electric voltage, denoted $V_{Reset}$, between the first and third electrodes 2, 6 of each resistive memory cell C, adapted to break the electrical conduction path 7 formed in step c). The second dielectric layer 5 of each resistive memory cell C has, on completion of step d), an electrical resistance, denoted $R_{off}$, preferably ranging between $10^4$ and $2.10^5$ ohms. By way of an example, $V_{Reset}$ can range between −1 V and −3 V.

The second electrode 4 of each resistive memory cell C is a floating potential electrode, i.e., the second electrode 4 is not subjected to a reference electrical potential during the operation of the resistive memory cell C.

Stack

A further aim of the invention is a stack for manufacturing resistive memory cells C, successively comprising:

a substrate 1, preferably comprising transistors and an interconnection layer;
a first electrode 2;
a first dielectric layer 3, having a first electrical strength;
a second metal electrode 4;
a second dielectric layer 5, having a second dielectric strength that is strictly less than the first dielectric strength;
a third electrode 6.

The technical features described above for the method (the substrate 1; the first, second, and third electrodes 2, 4, 6; the first and second dielectric layers 3, 5) also apply to this aim of the invention.

The invention is not limited to the disclosed embodiments. A person skilled in the art is able to consider their technically operative combinations, and to substitute them with equivalents.

The invention claimed is:

1. A method for manufacturing resistive memory cells, comprising the steps:

a) providing a stack successively comprising:
a substrate;
a first electrode;
a first dielectric layer, having a first electrical strength;

a second electrode;
a second dielectric layer, having a second dielectric strength that is strictly less than the first dielectric strength; and
a third electrode;
the first dielectric layer and the second electrode having a first interface, the second dielectric layer and the second electrode having a second interface; and
b) etching the stack by bombardment with electrically charged species, so as to define resistive memory cells;
the bombardment of step b) being adapted so that electrically charged species accumulate at the first and second interfaces of each resistive memory cell, so as to generate an electric field that is strictly less than the first electrical strength and is strictly greater than the second dielectric strength.

2. The method according to claim 1, wherein the electrically charged species accumulate in step b) at the first and second interfaces of each resistive memory cell, according to a surface charge density adapted to generate the electric field that is strictly less than the first electrical strength and is strictly greater than the second dielectric strength.

3. The method according to claim 1, wherein a thickness of the first dielectric layer of the stack provided in step a) is selected as a function of the electric field generated in step b) so as to allow a tunnel current circulating between the first and second electrodes.

4. The method according to claim 1, further comprising:
a step c) involving applying a first electric voltage, denoted $V_{Set}$, between the first and third electrodes of each resistive memory cell, adapted to form an electrical conduction path within the second dielectric layer connecting the second and third electrodes;
a step d) involving applying a second electric voltage, denoted $V_{Reset}$, between the first and third electrodes of each resistive memory cell, adapted to break the electrical conduction path formed in step c);
wherein the second dielectric layer of each resistive memory cell has, on completion of step d), an electrical resistance denoted $R_{off}$;
and wherein the first dielectric layer of the stack provided in step a) is adapted to have an electrical resistance that is strictly less than $R_{off}$.

5. The method according to claim 1, wherein step a) is performed so that the second dielectric layer is made of a hafnium oxide, and the bombardment of step b) is adapted so that electrically charged species accumulate at the first and second interfaces of each resistive memory cell, according to a surface charge density ranging between $10^{13}$ C per $cm^2$ and $5.10^{13}$ C per $cm^2$.

6. The method according to claim 1, wherein step b) is performed using an etching technique selected from a group consisting of reactive ion etching and plasma etching.

* * * * *